(12) United States Patent
Tsironis

(10) Patent No.: US 7,449,893 B1
(45) Date of Patent: Nov. 11, 2008

(54) HARMONIC LOAD PULL TUNER WITH RESONANT PREMATCHING MODULE

(76) Inventor: Christos Tsironis, 1603 St. Regis, Dolland-des-Ormeaux, Quebec (CA) H9B-3H7

( * ) Notice: Subject to any disclaimer, the term of this patent is extended or adjusted under 35 U.S.C. 154(b) by 66 days.

(21) Appl. No.: 11/487,346

(22) Filed: Jul. 17, 2006

(51) Int. Cl.
 *G01R 27/04* (2006.01)
(52) U.S. Cl. ............... 324/633; 324/636; 324/637; 324/623
(58) Field of Classification Search ........... 324/623, 324/633, 636, 637
See application file for complete search history.

(56) References Cited

U.S. PATENT DOCUMENTS

| | | | | |
|---|---|---|---|---|
| 3,953,796 | A | * | 4/1976 | Keller ............... 324/719 |
| 6,297,649 | B1 | | 10/2001 | Tsironis |
| 6,674,293 | B1 | | 1/2004 | Tsironis |
| 7,042,233 | B1 | * | 5/2006 | Boulerne ............. 324/642 |

2004/0207426 A1* 10/2004 Tsironis ............... 324/764

OTHER PUBLICATIONS

Product Note 41: "Computer Controlled Microwave Tuner, CCMT" Focus Microwaves Inc, Jan. 1998.
Tsironis, C, Meierer, R: "Laod Pull Tuners are Frequency Selective". Microwaves & RF Magazine Jan. 2004.

* cited by examiner

Primary Examiner—Vincent Q. Nguyen

(57) ABSTRACT

A harmonic rejection load pull tuner uses a resonant pre-matching module in order to enhance the reflection factor (tuning range) at the fundamental frequency without affecting the tuning range at the harmonic frequencies. The insertion loss of the harmonic tuner itself, if such a pre-matching module is not used, reduces the tuning range, generated by a wideband tuner at the fundamental frequency, connected after the harmonic tuner. In order to re-establish and increase the tuning range of the fundamental tuner a resonant pre-matching module is used, which increases the tuning range at the fundamental frequency and has no effect on the harmonic impedances. A wideband pre-matching module is not useful, since while it increases the tuning range at the fundamental frequency, it limits the tuning range at the harmonic frequencies.

6 Claims, 24 Drawing Sheets

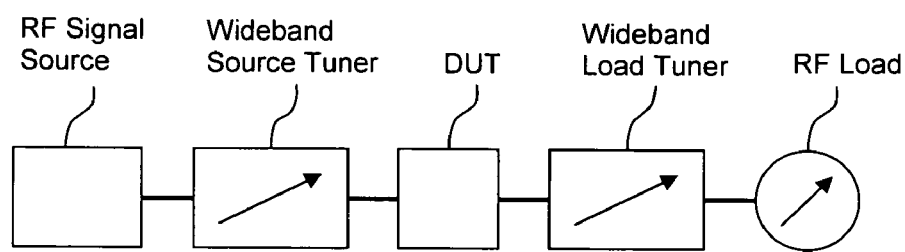
FIGURE 1: Prior Art, schematic wideband load pull setup using wideband slide screw tuners

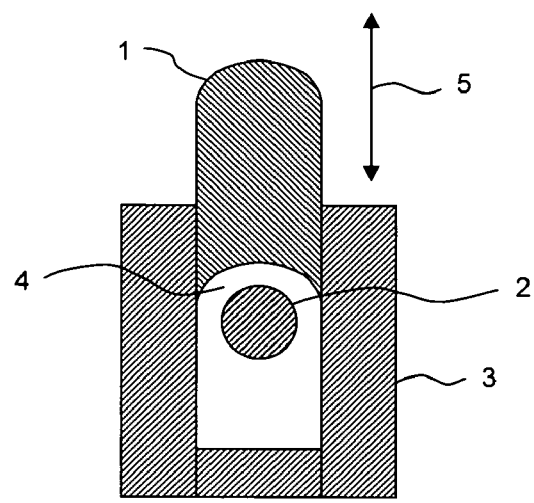
FIGURE 2: Prior Art, cross section of wideband probe of slide screw tuner

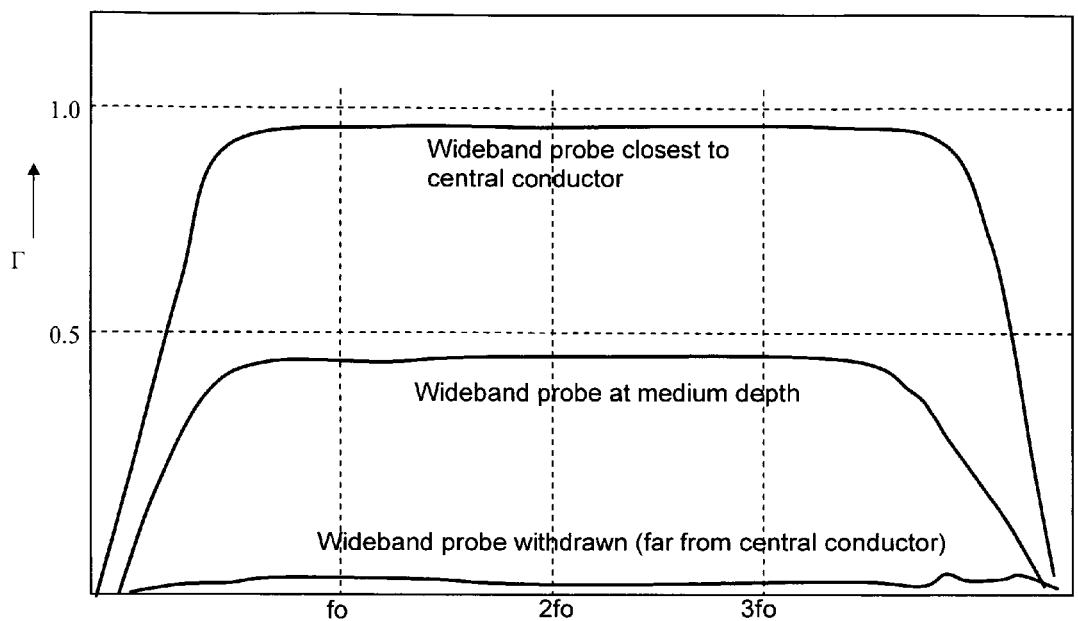
FIGURE 3: Prior Art, frequency response of slide screw tuner for various probe depths

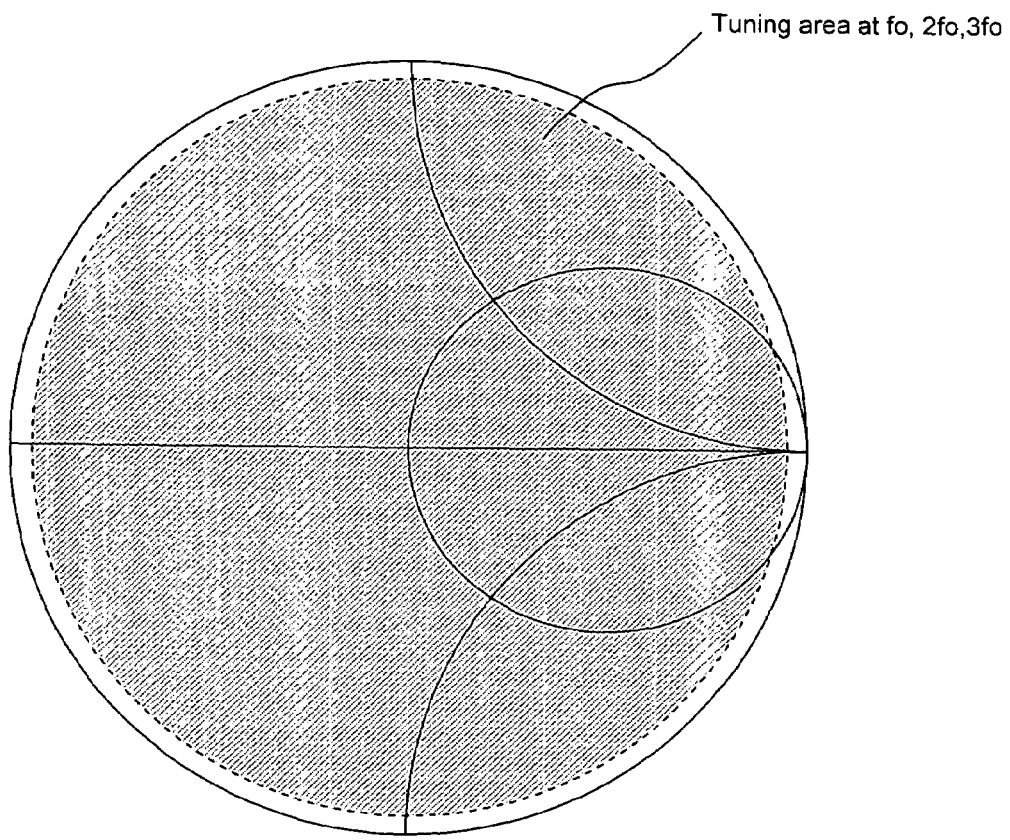
FIGURE 4: Prior Art, wideband fundamental tuning range without harmonic rejection tuner and without pre-matching module

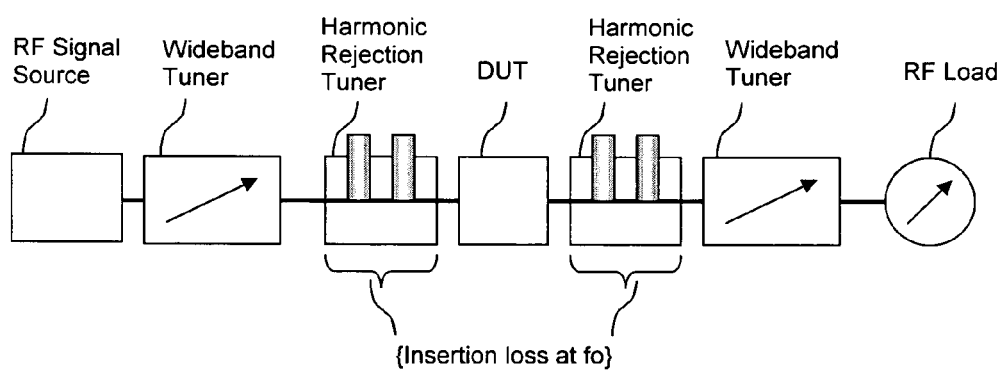
FIGURE 5: Prior Art, schematic harmonic load pull setup using slide screw tuners and harmonic rejection tuners

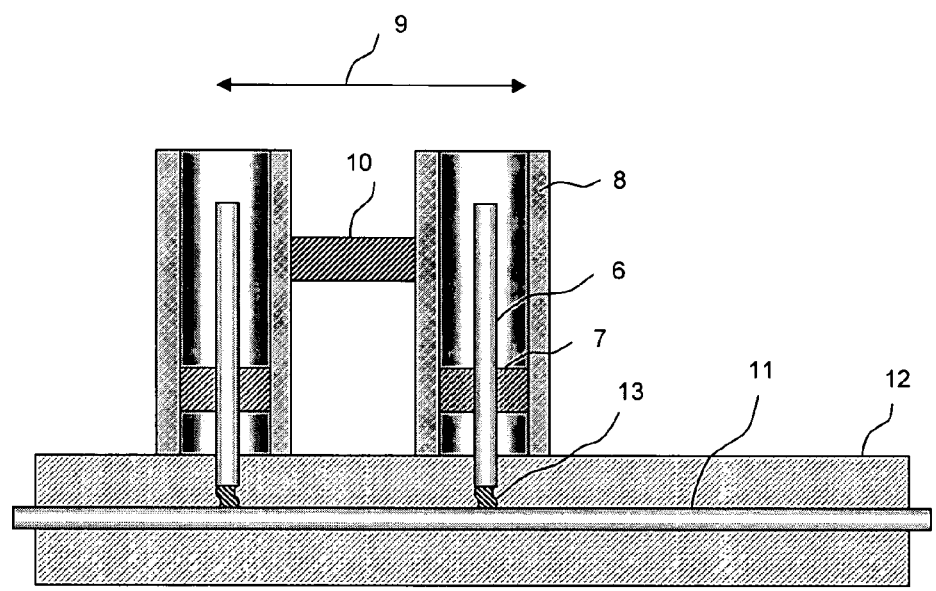
FIGURE 6: Prior Art, side view section of harmonic resonators in harmonic rejection tuners

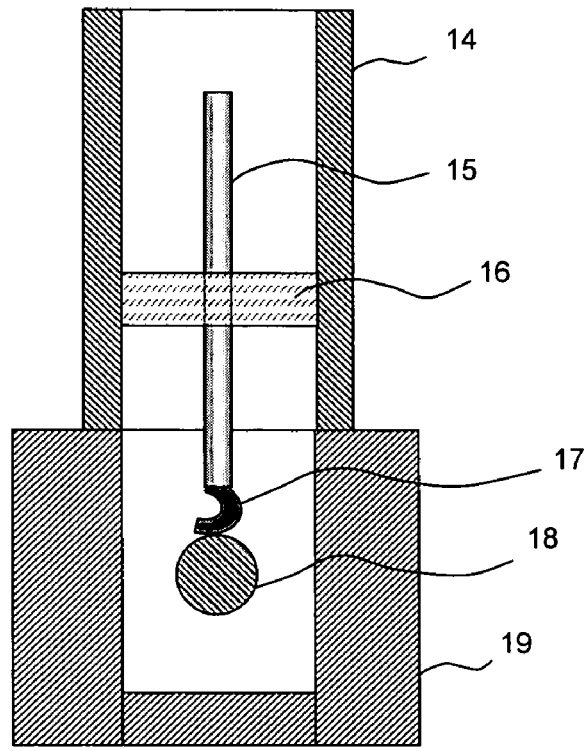
FIGURE 7: Prior Art, cross section of harmonic resonator in harmonic rejection tuners, where the resonator stub has sliding galvanic contact with the central conductor

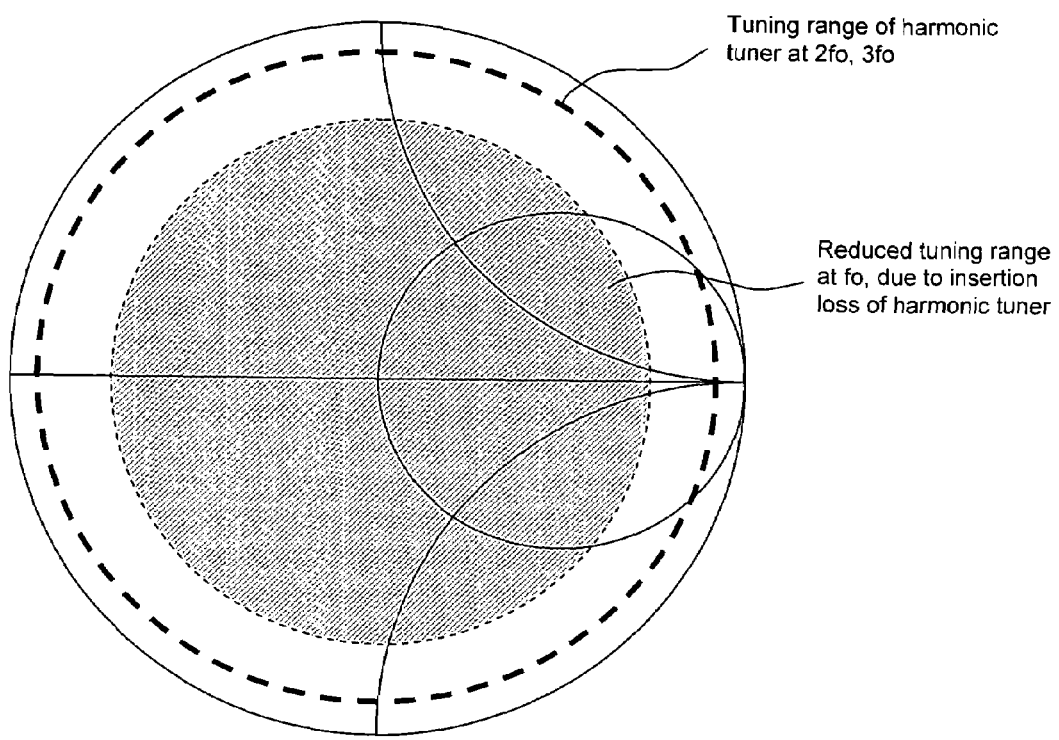
FIGURE 8: Prior Art, wideband fundamental and harmonic tuning range with wideband and harmonic rejection tuners

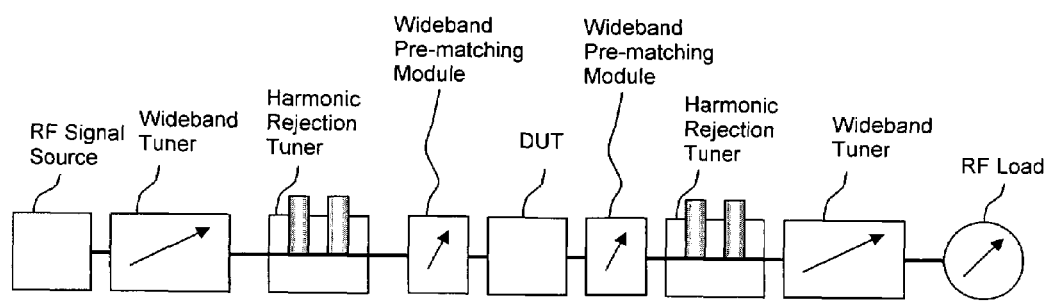
FIGURE 9: Schematic harmonic load pull setup using slide screw tuners, harmonic rejection tuners and wideband pre-matching modules in order to increase the tuning range at fo

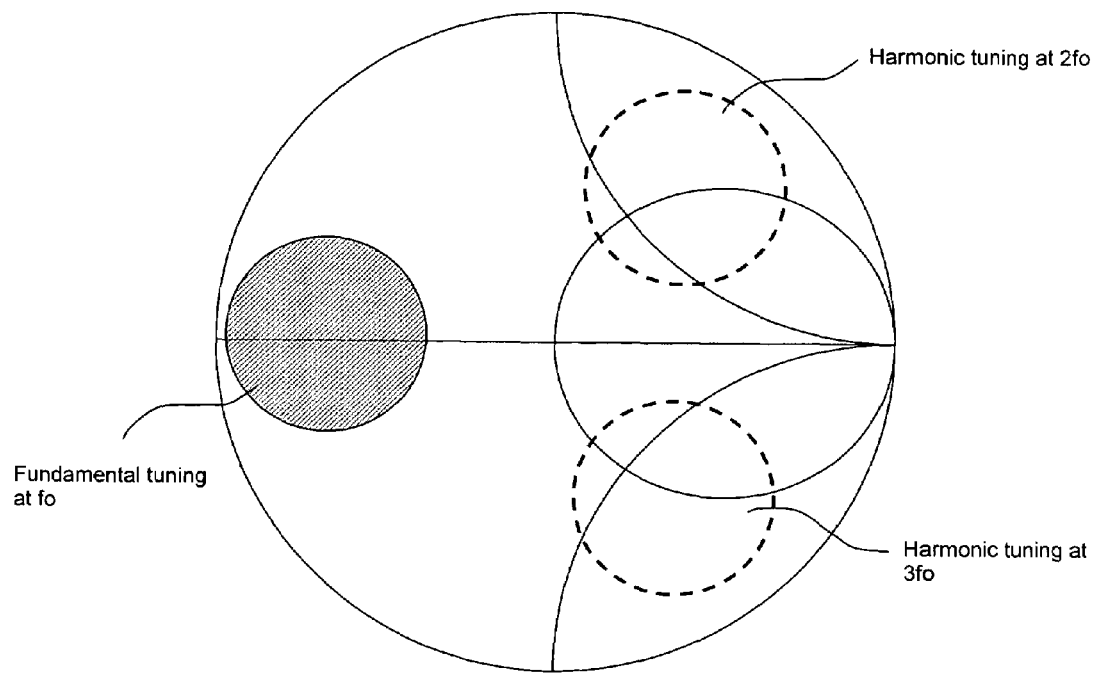
FIGURE 10: Prior Art, wideband fundamental and harmonic tuning with harmonic rejection tuner and wideband pre-matching module

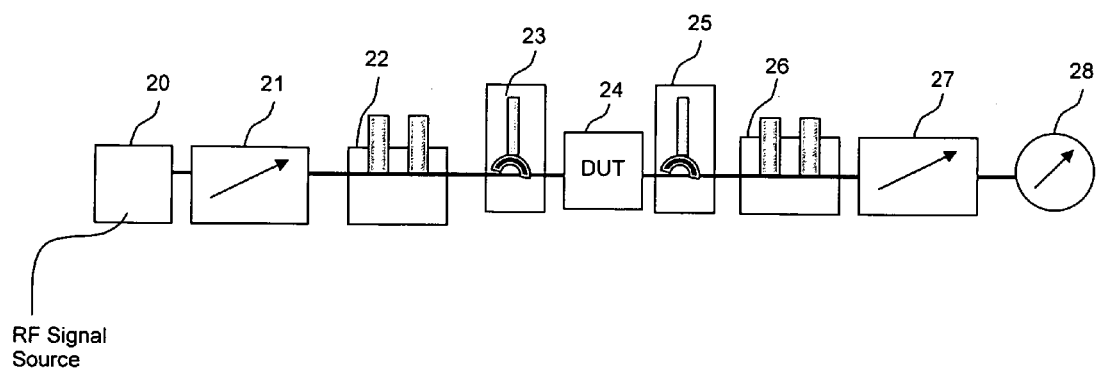
FIGURE 11 (corrected): Schematic harmonic load pull setup using slide screw tuners, harmonic rejection tuners and resonant pre-matching modules in order to increase the tuning range at fo

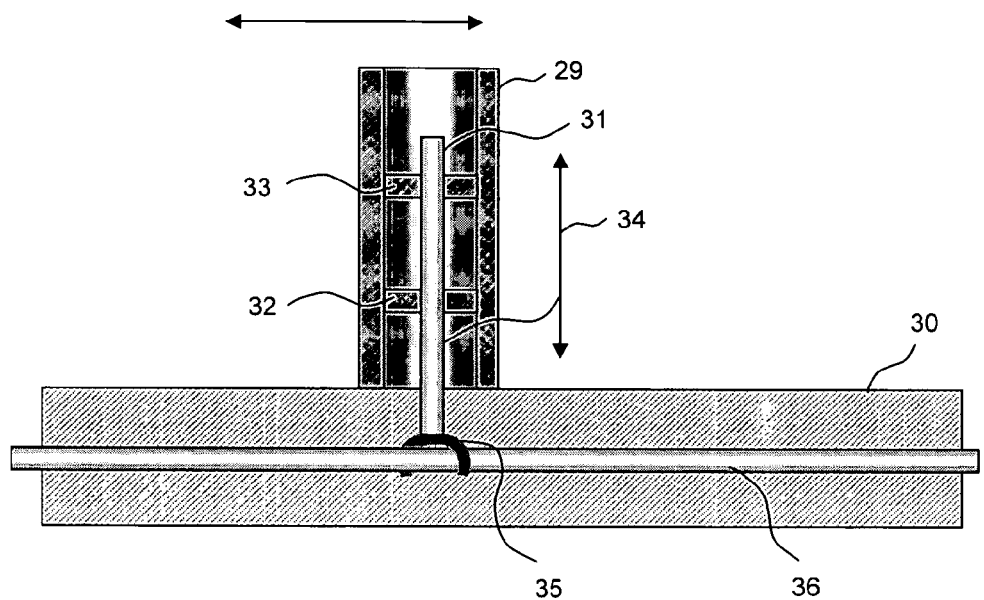
FIGURE 12: Side view section of resonant pre-matching module with capacitive coupling between resonator and central conductor

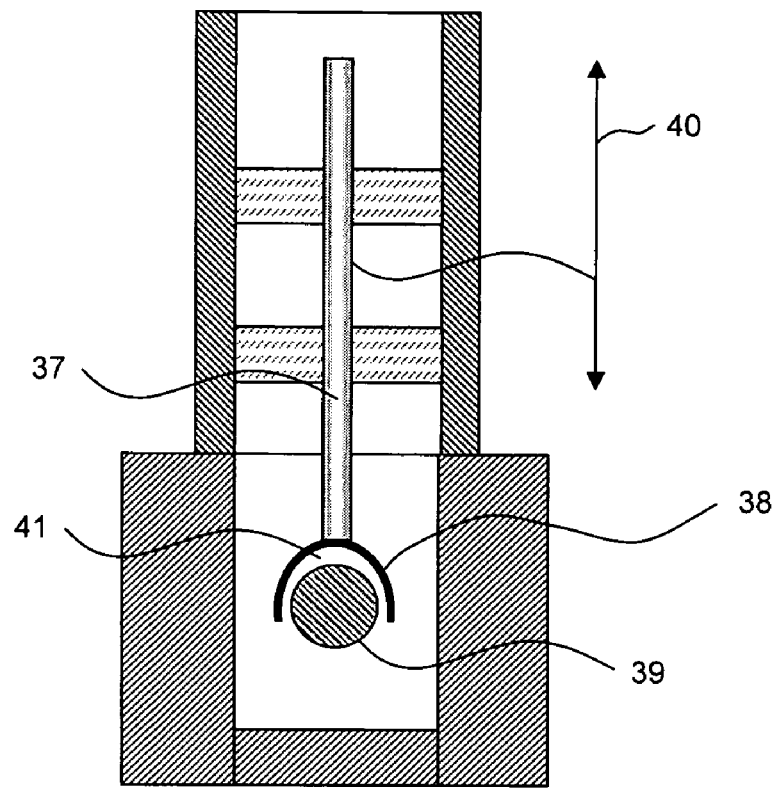
FIGURE 13: Cross section of resonant pre-matching module with capacitive coupling between resonator and central conductor

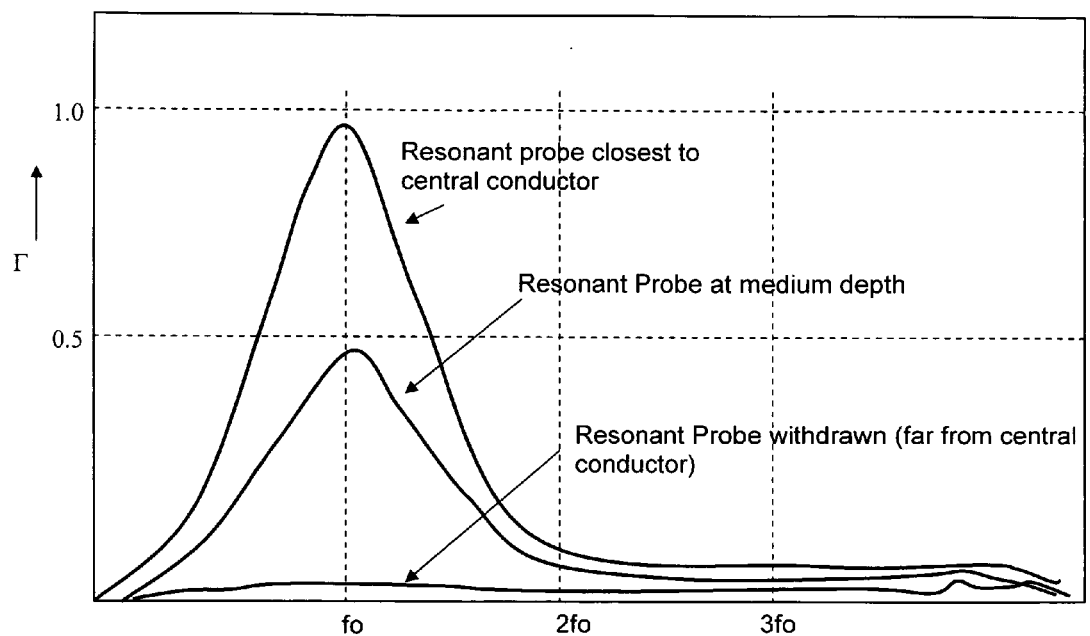
FIGURE 14: Prior Art, Frequency response of slide screw tuner for various probe depths

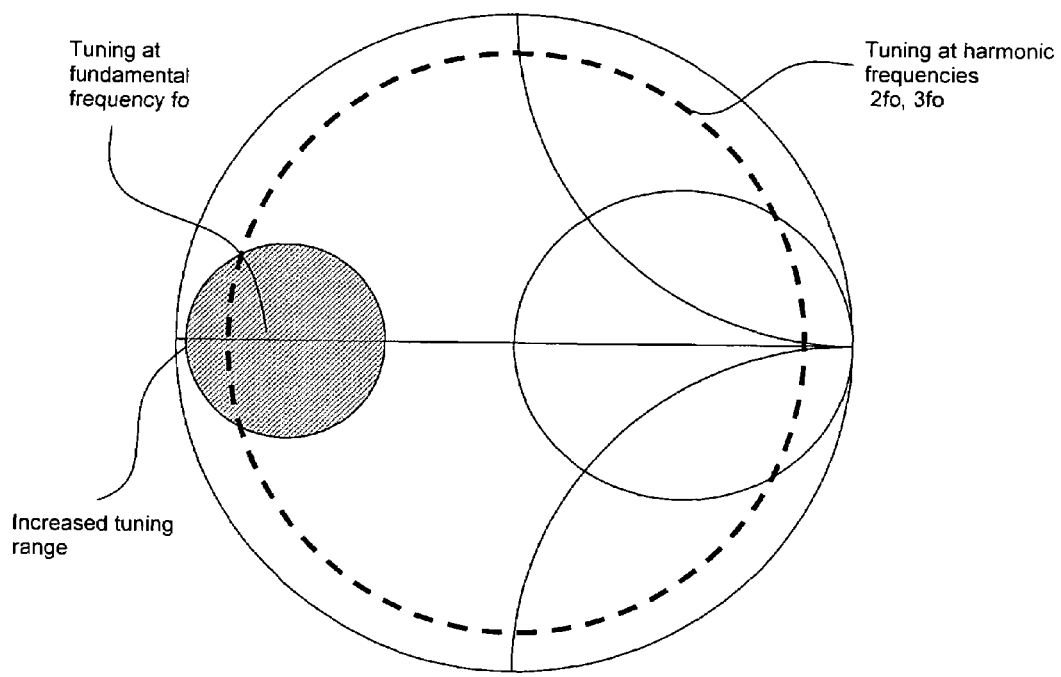
FIGURE 15: Fundamental and harmonic tuning with harmonic rejection tuner and resonant pre-matching module

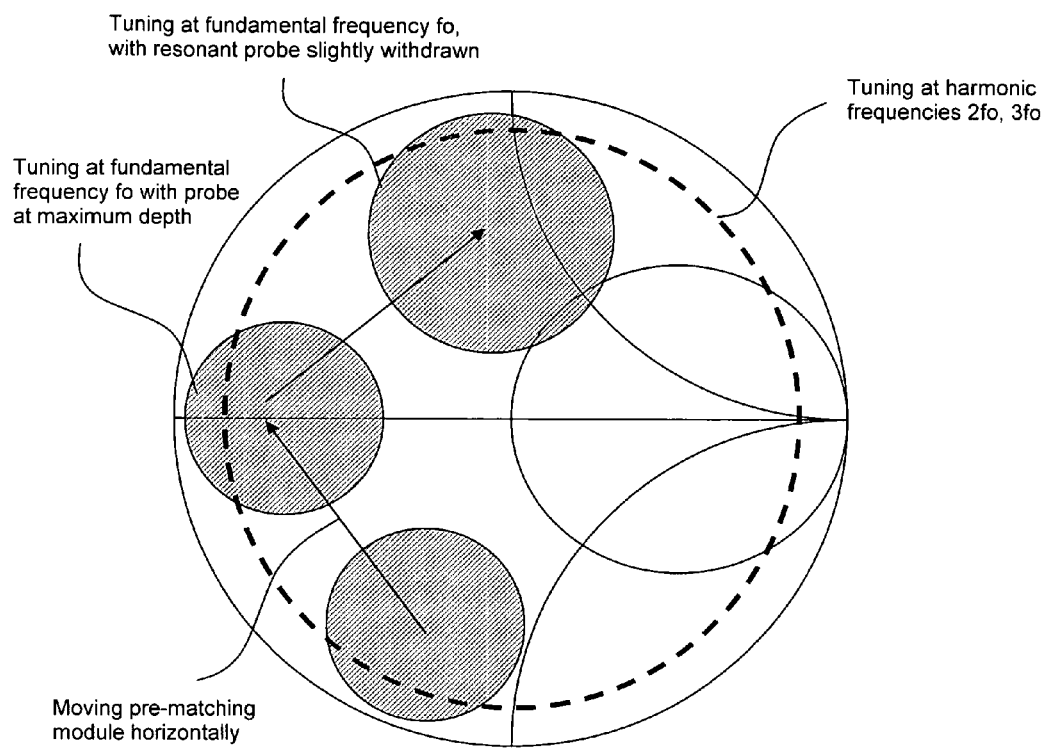
FIGURE 16: Changing the fundamental tuning area with horizontal movement of resonant probe of resonant pre-matching module

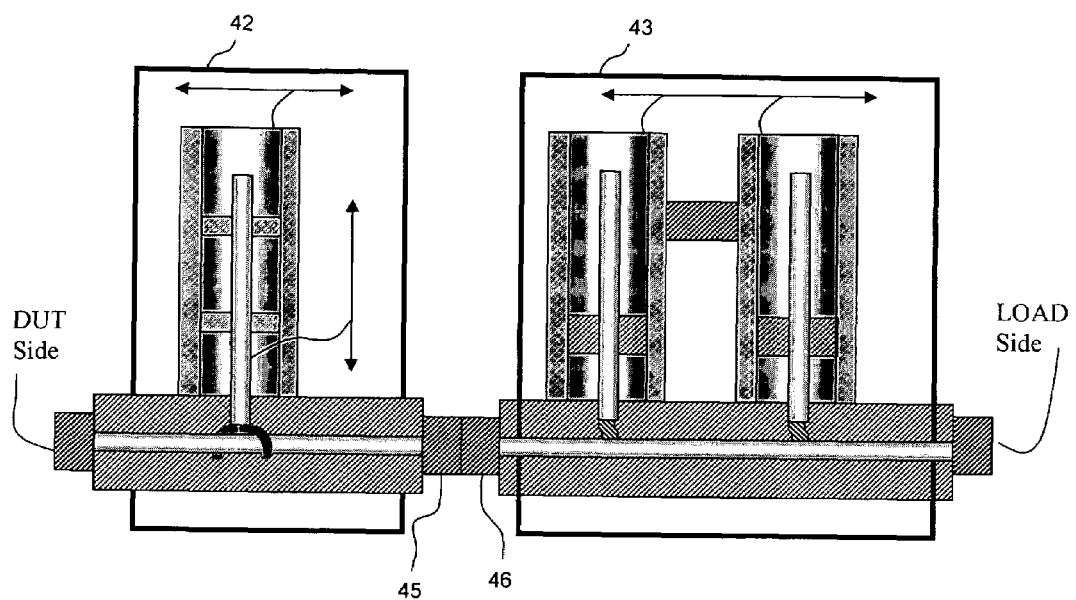
FIGURE 17: Resonant pre-matching module and Harmonic rejection tuner configured as two separate units

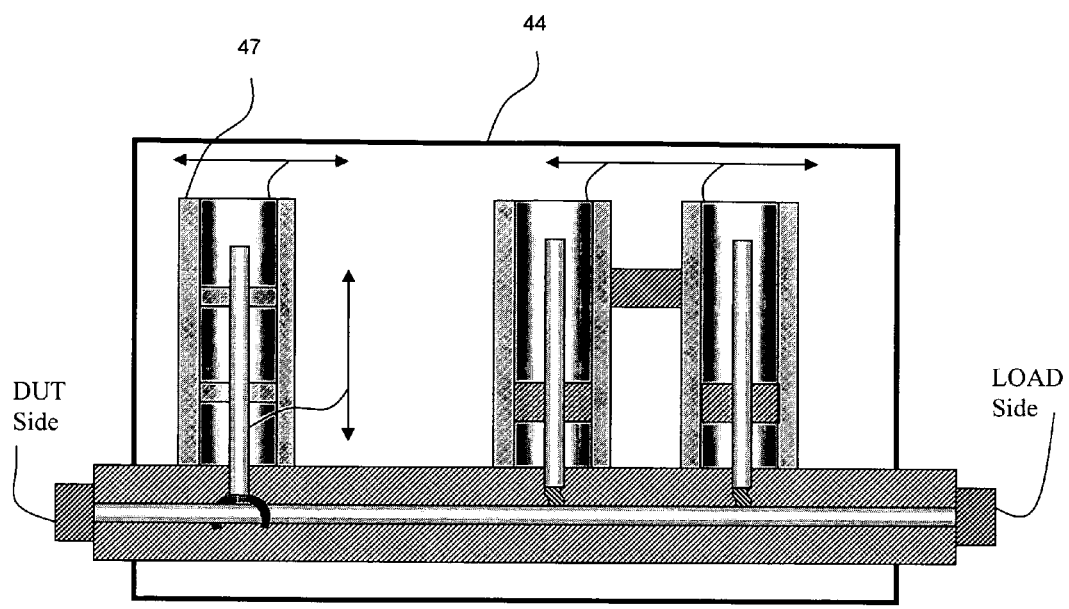
FIGURE 18: Harmonic rejection tuner with incorporated resonant pre-matching module

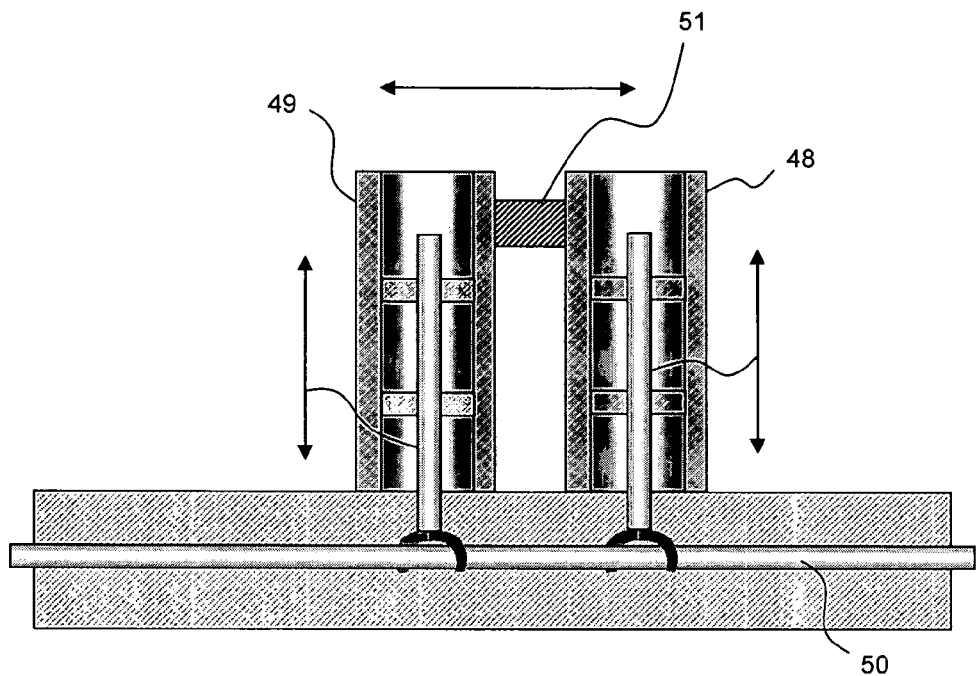
FIGURE 19: Side view section of double resonant pre-matching module, where the resonator stubs are mounted in different linked together cavities

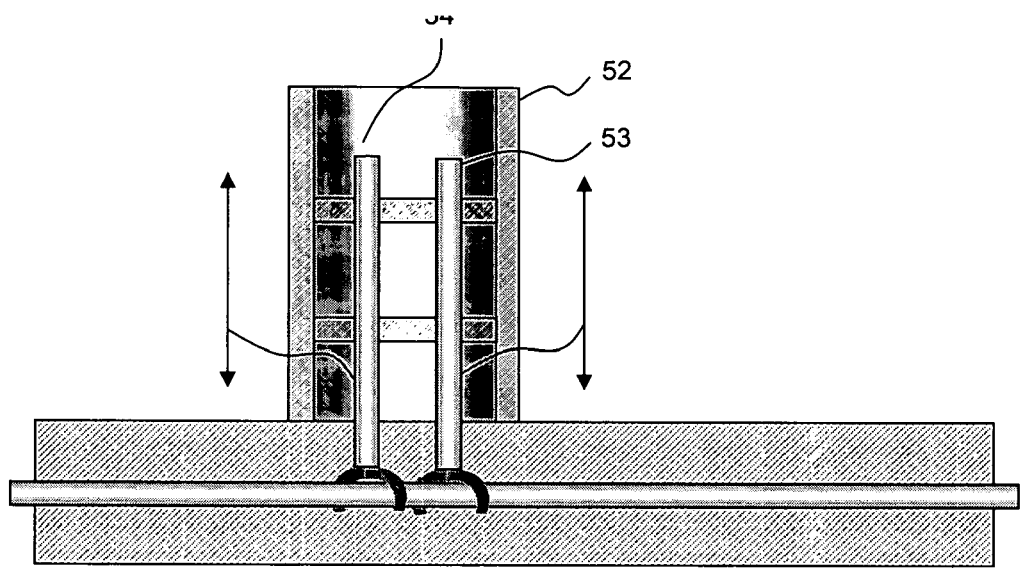
FIGURE 20: Side view section of dual resonant pre-matching module, where both resonator stubs are mounted in the same cavity

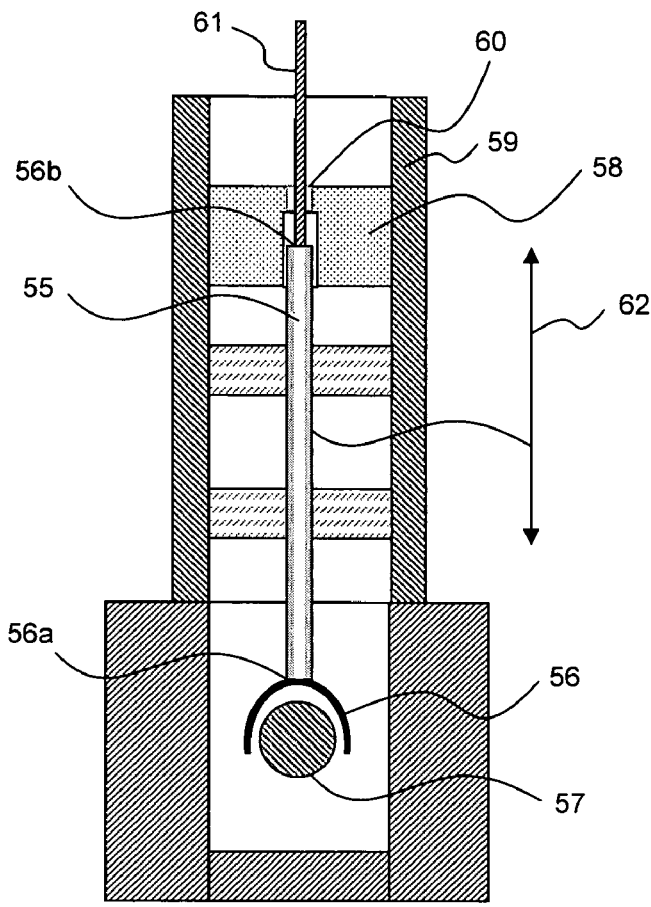
FIGURE 21: Cross section of resonant pre-matching module with capacitive coupling between resonator and central conductor and capacitive load at the open end of the resonator stub.

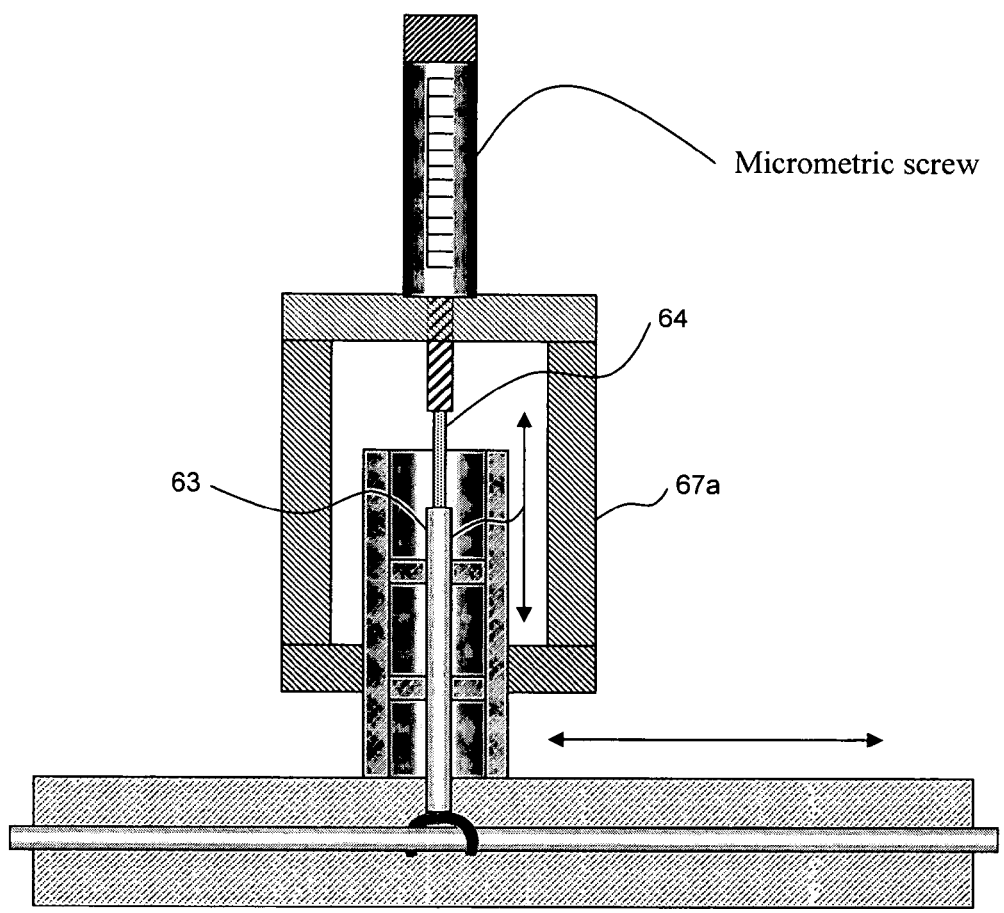
FIGURE 22: Side view section of manually controlled resonant pre-matching module

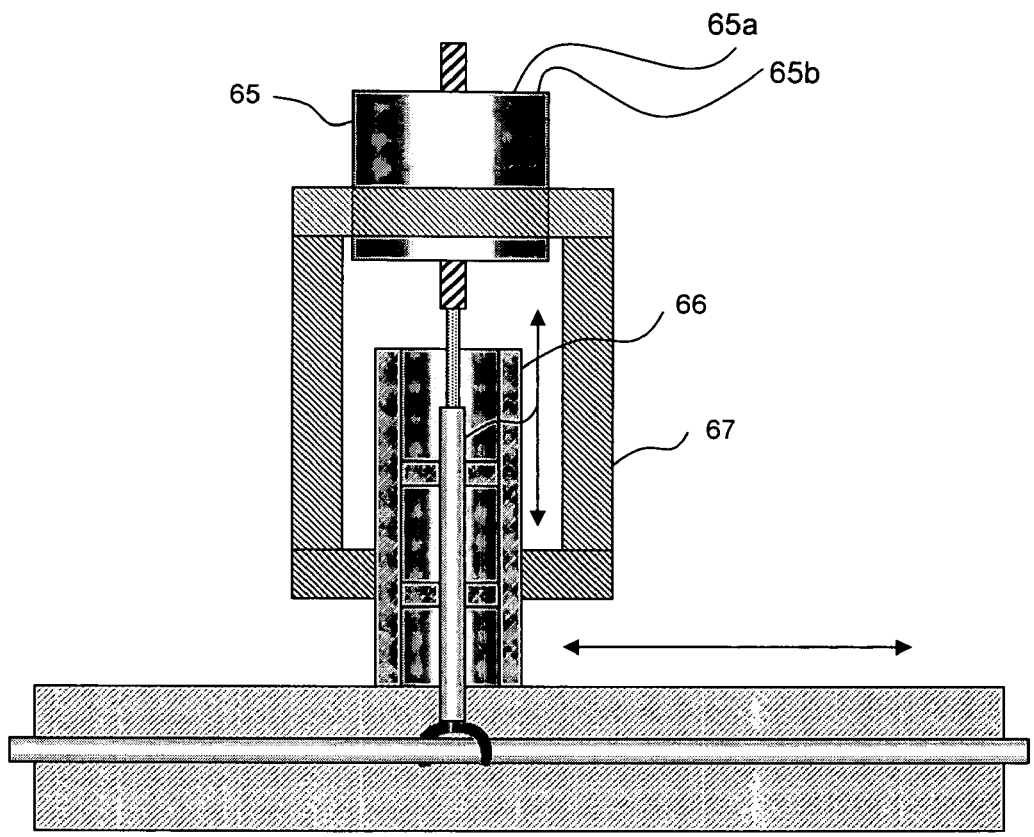
FIGURE 23: Side view section of resonant pre-matching module with remotely controlled vertical position of resonator stub.

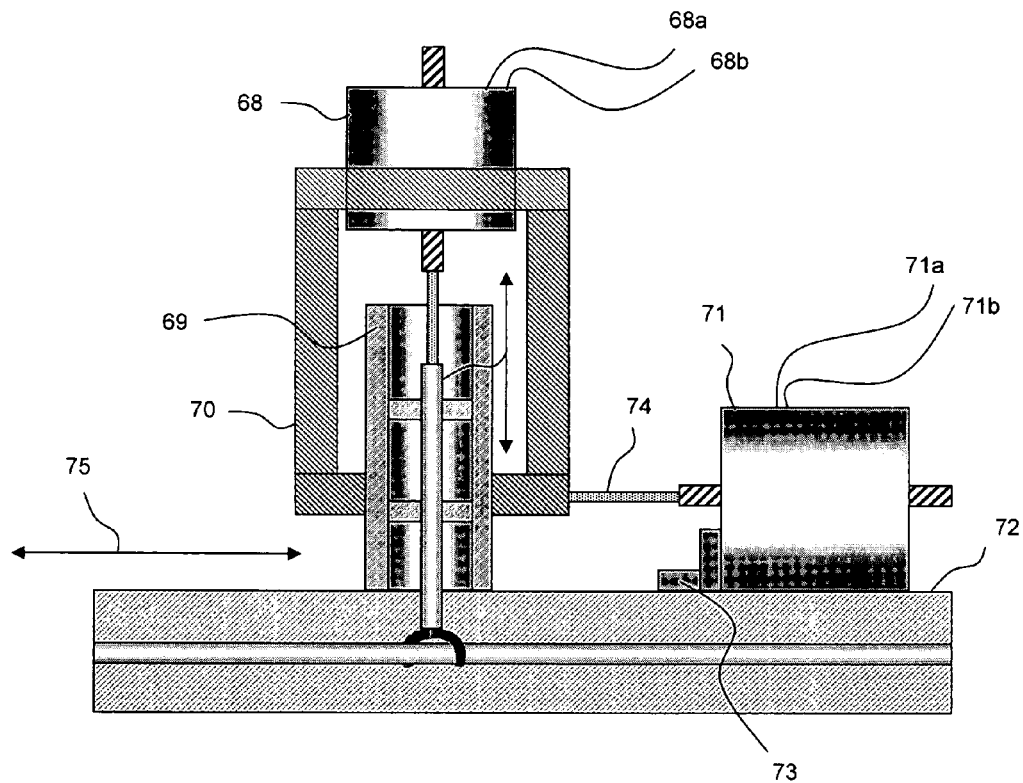
FIGURE 24: Side view section of horizontally and vertically remotely controlled resonant pre-matching module.

HARMONIC LOAD PULL TUNER WITH RESONANT PREMATCHING MODULE

PRIORITY CLAIM

Not Applicable

CROSS-REFERENCE TO RELATED ARTICLES

[1] "Product Note #41: Computer Controlled Microwave Tuner, CCMT", Focus Microwaves Inc., January 1998.
[2] Tsironis, C. U.S. Pat. No. 6,297,649, "Harmonic rejection load tuner"
[3] Tsironis, C. U.S. Pat. No. 6,674,293, "Adaptable Prematched tuner system and method".
[4] Tsironis, C, Meierer, R: "Load Pull Tuners are Frequency Selective", Microwaves & RF Magazine, January 2004.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to testing of microwave transistors under high power (non-linear) conditions using automatic microwave impedance tuners in order to synthesize reflection factors (or impedances) at the input and output of said transistors at the fundamental and various harmonic frequencies. This method of testing is commonly called "load pull".

Modern design of high power microwave amplifiers, oscillators and other active components used in various communication systems requires accurate knowledge of the active device's (microwave transistor's) characteristics. In such circuits, it is insufficient and inaccurate for the transistors operating at high power in their highly non-linear regions and close to saturation, to be described using analytical or numerical models. Instead the devices must be characterized using specialized test setups under the actual operating conditions.

DESCRIPTION OF PRIOR ART

A popular method for testing and characterizing such microwave components (transistors) for high power operation is "load pull" and "source pull". Load pull or source pull are measurement techniques employing wideband slide screw microwave tuners, RF signal sources, RF loads and other microwave test equipment (FIG. 1). The wideband microwave tuners in particular are used in order to manipulate the microwave impedance conditions under which the Device Under Test (DUT, or transistor) is tested.

When the injected power into the transistors reaches a certain level and drives the said transistors into saturation a sinusoidal input signal is deformed when it is amplified by and exits from the DUT, which generates harmonic signal components at the output; for instance if the input signal is at a fundamental frequency (fo), the output signal will include components at fo, 2fo, 3fo etc; the nfo (n>1) components are called harmonics.

Electro-mechanical tuners, as used in set-ups as in FIG. 1, usually employ the 'slide screw' principle, a tuning mechanism shown in cross section in FIG. 2; in this configuration the capacitive coupling between the vertical probe 1 and the central conductor 2 of the slotted airline (slabline) 3 creates a wideband reflection factor (Γ), of which the amplitude can be adjusted by inserting the probe 1 into the slabline 3 vertically 5 and therefore modifying the gap 4 between the probe and the central conductor and this way changing the value of the capacitance between the central conductor 2 and the probe 1. The smaller the gap 4, the higher the capacitance between RF probe and central conductor and thus the higher the magnitude of the reflection factor Γ.

In order to change the phase of the reflection factor Γ the microwave probe 1 already inserted in the slabline 3, must be moved horizontally along the axis of the slabline and at constant distance from the center conductor 2 (FIG. 2).

The basic behavior of such slide-screw tuners is that they create a wideband reflection factor covering typically all harmonic frequencies fo, 2fo and 3fo (FIG. 3). As the proximity of the probe 1 to the central conductor 2 increases the reflection factor over a wide frequency range increases as well (FIG. 3). It is therefore impossible to change the impedances (tune) at the fundamental and harmonic frequencies independently using slide screw tuners as shown in FIG. 2.

Slide screw tuners (FIG. 2) have a tuning range covering homogenously the entire area of the Smith chart (FIG. 4) equally at the fundamental and at the harmonic frequencies and reach the required impedance to conjugate match the DUT. The disadvantage, as discussed before, is that the impedances at the harmonic frequencies cannot be tuned independently. "Harmonic tuning" is therefore impossible using wideband tuners.

Optimizing the performance of the transistor in amplifier circuits however does require also the impedances at the harmonic frequencies, especially 2fo and 3fo to be independently controlled and optimized while, at the same time, the impedance presented to the transistor at the fundamental frequency must match its, typically very low, internal impedance, which corresponds to a very high reflection factor Γ(fo) or VSWR. This is done using "harmonic load pull" setups (FIG. 5). Harmonic load pull is possible using harmonic tuners, of which the "harmonic rejection tuners" [2] are a popular solution (FIG. 5) and are inserted between the DUT and the previously described wideband tuners, which serve now as fundamental (fo) tuners only.

The harmonic rejection tuners use λ/4 long open stubs 6, 15 at the harmonic frequency (FIGS. 6, 7), mounted inside a coaxial cavity 8, 14 and held in place using low loss dielectric spacers 7, 16; said λ/4 stubs slide along the slotted airline 12, 19 and make galvanic contact 13, 17 with the central conductor 11, 18. A set of two identical resonators is usually employed and moved horizontally 9 tied together using a rigid metallic or plastic bar 10 (FIG. 6).

The harmonic rejection tuners are inserted between the wideband fundamental tuners and the transistor and create a constant high reflection factor Γ at the harmonic frequencies when the resonator assembly is sliding along the slabline. The phase of Γ can be controlled by the horizontal position of said resonator assembly. Shown as a broken line on the Smith chart (FIG. 8) is the tuning of the harmonic tuner at the harmonic frequencies 2fo and 3fo; the grey shadowed area in FIG. 8 represents the tuning range at the fundamental frequency fo generated by the wideband tuner in FIG. 5. Compared with FIG. 4 the tuning range at fo is clearly reduced;

this, undesired drawback, is due to the insertion loss at the fundamental frequency introduced by the harmonic rejection tuners (FIG. 5).

In order to compensate for the loss of tuning range at the fundamental frequency a pre-matching module may be used and is inserted between the DUT and the harmonic tuners (FIG. 9). This will increase the tuning range at fo as shown in FIG. 10. Such pre-matching modules are known only of the slide-screw wideband type [3]. The wideband frequency response (FIG. 3) of those modules affects the harmonic frequencies 2fo and 3fo as well. The result is shown in FIG. 10. The tuning patterns show that the tuning of the harmonic frequencies generated by the harmonic tuners is largely impeded; It is therefore impossible to maintain the same tuning range at the harmonic frequencies, as in FIG. 8, when a pre-matching module is used to increase the tuning range at the fundamental frequency.

It is the aim of this invention to introduce a different type of pre-matching module, a resonant pre-matching module, which allows increasing the tuning range at the fundamental frequency without impeding the tuning range at the harmonic frequencies.

The concept of a frequency selective probe has been presented before [4]; however it was used only to tune harmonic frequencies. In this application the harmonic tuning is made using a harmonic rejection tuner with contacting resonator probes [2]. The non-contacting probe is used in addition to the harmonic tuner in order to pre-match at the fundamental frequency only and leave the harmonic frequencies un-affected. This is a new type of harmonic tuner.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a load pull test set-up using passive electro-mechanical tuners.

FIG. 2 depicts prior art, a cross section of wideband probe of slide screw tuner.

FIG. 3 depicts prior art, the frequency response of slide screw tuner for various probe depths.

FIG. 4 depicts prior art, the wideband fundamental tuning range without harmonic rejection tuner and without pre-matching module.

FIG. 5 depicts prior art, a schematic harmonic load pull setup using slide screw tuners and harmonic rejection tuners.

FIG. 6 depicts prior art, a side view section of harmonic resonators in harmonic rejection tuners.

FIG. 7 depicts prior art, a cross section of harmonic resonator in harmonic rejection tuners, where the resonator stub has sliding galvanic contact with the central conductor.

FIG. 8 depicts prior art, the wideband fundamental and harmonic tuning range with wideband and harmonic rejection tuners.

FIG. 9 depicts a schematic harmonic load pull setup using slide screw tuners, harmonic rejection tuners and wideband pre-matching modules in order to increase the tuning range at fo.

FIG. 10 depicts prior art, the wideband fundamental and harmonic tuning with harmonic rejection tuner and wideband pre-matching module.

FIG. 11 depicts a schematic harmonic load pull setup using slide screw tuners, harmonic rejection tuners and resonant pre-matching modules in order to increase the tuning range at fo.

FIG. 12 depicts a slide view section of resonant pre-matching module with capacitive coupling between resonator and central conductor.

FIG. 13 depicts a cross section of resonant pre-matching module with capacitive coupling between resonator and central conductor.

FIG. 14 depicts prior art, the frequency response of slide screw tuner for various probe depths.

FIG. 15 depicts the fundamental and harmonic tuning with harmonic rejection tuner and resonant pre-matching module.

FIG. 16 depicts the changing of the fundamental tuning area with horizontal movement of resonant probe of resonant pre-matching module.

FIG. 17 depicts a resonant pre-matching module and Harmonic rejection tuner configured as two separate units.

FIG. 18 depicts a harmonic rejection tuner with incorporated matching module.

FIG. 19 depicts a side view section of double resonant pre-matching module, where the resonator stubs are mounted in different linked together cavities.

FIG. 20 depicts a side view section of dual resonant stubs are in the same cavity.

FIG. 21 depicts a cross section of resonant pre-matching module with capacitive coupling between resonator and central conductor and load at the open end of the resonator stub.

FIG. 22 depicts a side view section of manually controlled resonant pre-matching module.

FIG. 23 depicts a side view section of resonant pre-matching module with remotely controlled vertical position of resonator stub.

FIG. 24 depicts a side view section of horizontally and vertically remotely controlled resonant pre-matching module.

DETAILED DESCRIPTION OF THE INVENTION

A harmonic load pull setup is described (FIG. 11), which allows a high tuning range both at the harmonic and the fundamental frequencies; both harmonic frequencies reach high reflection factors covering 360 degrees on the Smith chart and at the fundamental frequency a very high reflection factor $\Gamma$ can be reached.

The setup of FIG. 11 includes an RF signal source 20 followed by a wideband slide screw tuner 21 and a harmonic rejection tuner 22. Up to here the setup is the same as in prior art (FIG. 5). However following the harmonic rejection tuner 22 is a source resonant pre-matching module 23, which is designed to generate controllable high reflection factor $\Gamma$ at the fundamental frequency only, while leaving the harmonic frequencies un-affected. The source resonant pre-matching module 23 is followed by the DUT 24 and a load resonant pre-matching module 25, a harmonic rejection tuner 26, a load wideband tuner 27 and an RF load 28.

A side section view and a cross section view of the resonant pre-matching modules 23, 25 are shown in FIGS. 12 and 13. They comprise a coaxial cavity 29, which slides on the slabline 30. Inside the coaxial cavity 29 there is an open stub 31, which is approximately $\lambda/4$ long at the fundamental frequency fo. The resonant open stub 31 is secured against the inner walls of the cavity 29 using two low loss dielectric washers 32, 33. Said washers allow the resonant stub to slide vertically up and down 34, always centered inside the coaxial cavity 29.

At the bottom of the resonant stub 31 there is a capacitive contact 35, fixed on the said stub, said capacitive contact being made in form of a half cylinder partly enveloping the central conductor 36 of the slabline 30 and creating an adjustable capacitive coupling between the resonant stub 31 and the central conductor 36, as the stub is moved up and down vertically 34, approaching but without ever making galvanic contact with the central conductor 36.

The resonant stub configuration is also shown in a cross section of the resonator assembly in FIG. 13. Here it is clearly shown how the resonant stub 37 is linked to the capacitive contact 38, which can be placed in various distances from the central conductor 39 by moving the stub vertically 40 and adjusting the gap 41 between the contact 38 and the central conductor 39.

The frequency response of a resonant assembly as shown in FIGS. 12 and 13, is shown in FIG. 14. The combination of resonant stub 37 and capacitance between the contact 38 and central conductor 39 create a frequency response, which reflects RF power at the fundamental frequency fo, but has small or negligible reflection at the harmonic frequencies 2fo and 3fo. The magnitude of the reflection factor Γ(fo) increases with increasing coupling between the resonant stub 37 and the central conductor 39. This means that one can create a tuning range improvement due to pre-matching at the fundamental frequency fo without affecting the tuning range at the harmonic frequencies 2fo and 3fo.

The improved tuning range for the fundamental frequency fo and the un-affected tuning range for the harmonic frequencies are shown in FIG. 15.

The fact that the resonant pre-matching module restricts the area of tuning due to pre-matching is not a handicap, because the restricted area can be rotated by simply sliding the resonant probe assembly along the axis of the slabline (FIG. 16) and the size of the restricted area can increased by using less coupling between the resonant probe and the central conductor of the slabline (FIG. 16), albeit at a slight loss of maximum Γ(fo).

The resonant pre-matching module can be either a separate device 42 cascaded between the DUT and the harmonic rejection tuner 43 (FIG. 17), or it can be integrated into the said harmonic tuner 44 (FIG. 18) and operated as a single unit.

In the case of a separate resonant pre-matching module 42 (FIG. 17) the main advantage is that each individual tuner 42, 43 will be smaller and easier to manufacture, but the disadvantage is that the insertion loss of the two RF adapters 45, 46 required between the pre-matching module 42 and the harmonic rejection tuner 43 will reduce the tuning range at the fundamental and the harmonic frequencies.

In the case of an integrated tuner 44 (FIG. 18) the resonant pre-matching module 47 is part of the overall harmonic rejection tuner 44. In this case there is no need for the interstage RF adapters 45, 46 and the insertion loss between said resonant pre-matching module and harmonic tuner is minimized, since the said two RF adapters between the two units, otherwise required, are eliminated.

The resonant pre-matching module uses one or more open stubs mounted inside coaxial resonator assemblies (cavities) 48, 49 and being capacitively coupled to the central conductor 50 of the slotted airline (slabline) (FIG. 19). The combination of more than one resonant stub assemblies creates higher frequency selectivity and therefore less influence on the harmonic frequencies. In this case both resonant assemblies 48, 49 must be linked together using a solid plastic or metal link 51.

Instead of using two separate cavity assembles to hold the two resonant stubs (FIG. 19), one can use a single cavity 52 and mount two such resonators 53, 54 inside (FIG. 20). This simplifies the structure and lowers manufacturing cost.

In general when increasing the capacitive coupling 56 between the resonator stub 55 and the central conductor 57 (FIG. 21) the magnitude of the reflection factor Γ(fo) increases as well (FIG. 14), but the resonance frequency decreases slightly as well. This is due to the increased capacitive load at the bottom end 56 of the resonant stub 55. This effect can in principle be tolerated, since load pull measurements are a fixed frequency operation. However this resonance shifting effect can be minimized if a capacitive load, in form of a dielectric tube 58 is mounted on the open end of the resonant stub and fixed inside the cavity 59. A small hole 60 is provided in the dielectric load 58 in order to be able to insert a thin dielectric stub 61 to attach to the resonator stub 55 and adjust the vertical position 62 of said resonator stub 55 relative to the central conductor 57.

The effect of the resonance frequency shift is due to change of overall capacitive load to the resonant stub 55. A λ/4 at fo open stub behaves like a series resonant circuit presenting a short circuit at the end 56a opposite to the stub's open end 56b. This short circuit is then coupled capacitively 56 to the central conductor 57 creating this way a variable reflection factor Γ(fo). When the capacitive coupling increases with the said stub moved closer to the central conductor the overall capacitive content of stub plus coupling capacitance increases and therefore the resonance frequency decreases.

A dielectric capacitive load in form of a cylinder 58 overlapping the open end of the said resonant stub 55, 56b compensates for the capacitance changes due to changing the capacitive coupling between resonator and central conductor: when the resonant stub 55 is moved away from the central conductor 57 the capacitive coupling is decreasing, but the capacitive load at the open end of the stub is increasing since the stub is entering more into the dielectric load 58. This partly compensates for the overall capacitive loading of the resonant stub and stabilizes the resonance frequency.

Compensated resonant pre-matching modules as described in FIG. 21 may of course be manually adjusted (FIG. 22) or automated (FIGS. 23, 24), or used in tandem configurations (FIGS. 19, 20).

Resonant pre-matching modules can be used with manual or automatic adjustment. A simple manual adjustment is shown in FIG. 22. It includes a micrometric screw, which is mounted on an appropriate bracket 67a and connected with the resonant stub 63 using a thin low loss dielectric member 64. This way an operator can mark and re-position the resonator stub at a later time.

A resonant pre-matching module can also be fully automated using either a single stepper motor 65 for the vertical movement, attached at the resonator cavity 66 using an appropriate bracket 67 and controlled through digital pulses from a computer via its electrical leads 65a and 65b (FIG. 23) or two stepper motors (FIG. 24) one vertical motor 68, fixed as before to the cavity 69 using the bracket 70, and one horizontal motor 71, fixed on the slabline 72, with an appropriate bracket 73 and attached to the cavity using a metallic or hard plastic member 74, allowing a smooth, remotely controlled horizontal movement 75, motor 68 driven through its terminals 68a and 68b and motor 71 driven through its terminals 71a and 71b.

In case of an automated setup (FIGS. 23 and 24) the stepper motors 65, 68 and 71 are controlled by a computer, which provides exact numerical positioning and repeatability of the positions, in case the module needs to be calibrated by appropriate control software and re-positioned exactly by control software already known in the art.

The scope of the invention as defined in the appended claims is directed, singly or in combination, to a resonant pre-matching module, which can be used either as a stand alone component or integrated with a harmonic rejection tuner and of which said pre-matching module's purpose is to compensate for the insertion loss of the harmonic tuner and increase the tuning range of a wideband fundamental tuner at the DUT reference plane without affecting at the same time the tuning range of the harmonic tuner at the harmonic frequencies.

Although the present invention has been explained hereinabove by way of a preferred embodiment thereof, it should be pointed out that other combinations of the described components are possible and, as far as obvious to a person skilled in the art, they shall not limit the scope of the present invention.

What I claim as my invention is:

1. A harmonic rejection load pull tuner comprising a test port and an idle port and a slotted airline (slabline) connecting both ports, said tuner uses two or more open conductive resonant stubs, of which said conductive stubs each one is mounted and fixed inside a conductive resonant cavity using low loss dielectric washers and is quarter lambda resonant at a harmonic frequency (2Fo or 3Fo) of a fundamental frequency Fo, said resonant stubs are positioned vertically relative to the slabline and make galvanic contact with the central conductor of the slabline and slide along the slabline, said tuner providing for an additional resonant pre-matching module to be inserted between the resonant stubs and the test port of said tuner.

2. A tuner as in claim 1, which comprises a resonant pre-matching module inserted between the test port and said resonant stubs, said pre-matching module comprises an open conducive stub which is quarter lambda resonant and tuned at the fundamental frequency (Fo), said conductive stub is mounted inside a coaxial conductive cavity using low loss dielectric washers, which allow it to be moved vertically relative to the central conductor of the slabline, said coaxial cavity slides on the lateral walls of said slabline and makes continuous perfect ground contact with the said walls of the slabline.

3. A tuner as in claim 2, in which said resonant stub of said pre-matching module has a semi-cylindrical conductive foil attached to its lower end, closest to the central conductor of said slabline and creates capacitive coupling between said resonant stub and said central conductor of said slabline, said resonant stub is attached to a vertical gear mechanism using low loss dielectric material, which positions said resonant stub at any distance from the central conductor of said slabline, in order to adjust said capacitive coupling between said resonant stub and said central conductor.

4. A tuner as in claim 3, in which said resonant stub of said pre-matching module has its open end partially covered by a dielectric tube, which slides tightly over the open end of said open stub, said dielectric tube can be moved vertically relative to said resonant stub and adjusts the effective electrical length of said resonant stub and by consequence its resonance frequency (Fo).

5. A tuner as in claim 4, in which the fixed contacting resonators can be moved horizontally relative to the test port of said tuner using appropriate gear and remotely controlled stepper motors, driven by a control computer running control software and make continuous and perfect galvanic contact with the central conductor of said slabline.

6. A tuner as in claim 5, in which the pre-matching module, which includes said variable capacitively coupled stub, can be moved horizontally relative to the test port of said tuner using appropriate gear and remotely controlled stepper motors, driven by a control computer running control software and makes continuous and perfect ground contact with the lateral walls of said slabline.

* * * * *